(12) United States Patent
Kim et al.

(10) Patent No.: US 9,252,112 B2
(45) Date of Patent: Feb. 2, 2016

(54) SEMICONDUCTOR PACKAGE

(71) Applicant: LG INNOTEK CO., LTD., Seoul (KR)

(72) Inventors: Dong Sun Kim, Seoul (KR); Sung Wuk Ryu, Seoul (KR); Ji Haeng Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/487,793

(22) Filed: Sep. 16, 2014

(65) Prior Publication Data

US 2015/0076691 A1 Mar. 19, 2015

(30) Foreign Application Priority Data

Sep. 16, 2013 (KR) .................. 10-2013-0110974
Sep. 27, 2013 (KR) .................. 10-2013-0115332
Sep. 27, 2013 (KR) .................. 10-2013-0115333

(51) Int. Cl.
| | | |
|---|---|---|
| H01L 21/302 | (2006.01) | |
| H01L 21/461 | (2006.01) | |
| H01L 23/00 | (2006.01) | |
| H01L 23/498 | (2006.01) | |
| H01L 23/538 | (2006.01) | |

(52) U.S. Cl.
CPC .......... *H01L 24/12* (2013.01); *H01L 23/49822* (2013.01); *H01L 23/5389* (2013.01); *H01L 2924/0105* (2013.01); *H01L 2924/01028* (2013.01); *H01L 2924/01029* (2013.01); *H01L 2924/01047* (2013.01); *H01L 2924/01079* (2013.01); *H01L 2924/01082* (2013.01); *H01L 2924/15* (2013.01); *H01L 2924/35* (2013.01); *H01L 2924/384* (2013.01)

(58) Field of Classification Search
CPC ............... H01L 2924/0179; H01L 21/302; H01L 21/461; H01L 2924/01029; H01L 2924/01078
USPC ............... 257/676, 738, 777; 438/106, 125
See application file for complete search history.

(56) References Cited

U.S. PATENT DOCUMENTS

| | | | |
|---|---|---|---|
| 2002/0121692 A1 | 9/2002 | Lee et al. | |
| 2008/0284001 A1* | 11/2008 | Mori et al. | .............. 257/712 |
| 2010/0283140 A1 | 11/2010 | Kim et al. | |
| 2011/0024899 A1* | 2/2011 | Masumoto et al. | .......... 257/737 |
| 2012/0013000 A1 | 1/2012 | Haba | |
| 2012/0145666 A1* | 6/2012 | Maeda | ............................ 216/20 |
| 2014/0183731 A1* | 7/2014 | Lin et al. | ..................... 257/738 |

OTHER PUBLICATIONS

Extended European Search Report dated Apr. 1, 2015 in European Application No. 14184685.7.

* cited by examiner

*Primary Examiner* — Phuc Dang
(74) *Attorney, Agent, or Firm* — Saliwanchik, Lloyd & Eisenschenk (57) ABSTRACT

Provided is a semiconductor package, including: a lower package to which elements are mounted; a metal post connected to the lower package and including at least one metal material portion; and an upper package to which elements is mounted, and which is connected to the metal post via a solder ball.

16 Claims, 8 Drawing Sheets

SEMICONDUCTOR PACKAGE

CROSS-REFERENCE TO RELATED APPLICATIONS

This application claims the benefit under 35 U.S.C. §119 of Korean Patent Application Nos. 10-2013-0110974, filed on Sep. 16, 2013; 10-2013-0115332, filed on Sep. 27, 2013; and 10-2013-0115333, filed on Sep. 27, 2013 which are hereby incorporated by reference in their entirety.

BACKGROUND

1. Field of the Invention

Embodiments of the present invention relate to a semiconductor package.

2. Description of the Related Arts

According to the development of semiconductor technologies, electronic devices have been miniaturized and have become lighter in order to meet the users' demand, and accordingly, a multi-chip packaging technology for implementing the same kind or different kinds of semiconductor chips as one unit package has been magnified. Compared to a package implemented by semiconductor chips, the multi-chip package is advantageous in terms of a package size or weight and a mounting process, and in particular, the multi-chip package is mainly applied to portable communication terminals for which miniaturization and weight lightening are required.

Among these multi-chip packages, a stack type package in which a package substrate is stacked on another package substrate is called a package on package (hereinafter referred to as "PoP"). As the semiconductor package has become higher in capacity, thinner in thickness and smaller in size with the development of semiconductor package technologies, the number stacked chips have been recently increased.

The conventional package on package applies a method of connecting two packages using a solder ball printing process and a reflow process or connecting an upper package, having memory dies mounted by forming vias up to a PoP pad of a lower package (through molded via method) by performing a laser drilling process with respect to a molding portion after molding the lower package and printing a solder ball in the vias, to the lower package using a reflow process.

However, in order to implement high integration and high performance of package on package products, the number of mounted dies has been increased or attempts to mount passive elements have been performed. To realize this, it is important to further increase a distance between packages.

However, the conventional semiconductor package is problematic in that cracks or collapse is generated from a solder ball when a size or a height of the solder ball is increased in order to increase a distance between the packages.

BRIEF SUMMARY

The present invention has been made to solve the above problem, and an aspect of the present invention is to provide a semiconductor package having high density realized by increasing a distance between an upper package and a lower package to increase the number of chips mounted, and excellent bonding reliability between the upper package and the lower package.

In order to solve the above problem, according to an aspect of an embodiment of the present invention, there is provided a semiconductor package, including: a lower package to which elements are mounted; a metal post connected to the lower package and including at least one metal material portion; and an upper package to which elements are mounted and which is connected to the metal post via a solder ball.

According to another embodiment of the present invention, the metal material portion may have a surface treatment layer formed on a surface thereof.

According to still another embodiment of the present invention, the surface treatment layer may be formed on an upper surface and a side of the metal post.

According to still another embodiment of the present invention, the surface treatment layer may be made of at least one metal material of Au and Ni.

According to still another embodiment of the present invention, a width of one end of the metal post connected to the solder ball may be formed smaller than that of another end.

According to still another embodiment of the present invention, the width of the metal post may be formed to increase gradually from the one end connected to the solder ball from the other end.

According to still another embodiment of the present invention, the metal post may be formed such that the width of the one end is 50% to 90% of the width of the other end.

According to still another embodiment of the present invention, the metal post may be formed such that a surface in a longitudinal direction is inclined at an angle of 5° to 45° with respect to a surface of a substrate of the lower package.

According to still another embodiment of the present invention, the one end of the metal post connected to the solder ball may be entered into the solder ball.

According to still another embodiment of the present invention, the metal post may be made of at least one material of Cu, Sn, Pb and Ag.

According to still another embodiment of the present invention, the metal post may include a solder portion of a first metal material and a metal material portion of a second metal material.

According to still another embodiment of the present invention, the solder portion may be made of an alloy material of Sn and Cu or an alloy material of Sn and Ag.

According to still another embodiment of the present invention, the solder portion may be configured so as to have a melting point of 230° to 250° C.

According to still another embodiment of the present invention, the lower package may include a substrate and a first seed pattern portion formed on the substrate, and the metal post may be formed on the first seed pattern portion.

According to still another embodiment of the present invention, the semiconductor package may further include a solder resist pattern formed on the first seed pattern portion so that part of an upper surface of the first seed pattern portion can be exposed.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Embodiments of the present invention will now be described more fully hereinafter with reference to the accompanying drawings, in which exemplary embodiments of the invention are shown. The invention may, however, be embodied in different forms and should not be construed as limited to the embodiments set forth herein. In the following description, it is to be noted that, when the functions of conventional elements and the detailed description of elements related with the present invention may make the gist of the present invention unclear, a detailed description of those elements will be omitted. Further, it should be understood that the shape and size of the elements shown in the drawings may be exaggeratedly drawn to provide an easily understood description of the structure of the present invention rather than reflecting the actual sizes of the corresponding elements.

Figure 1:
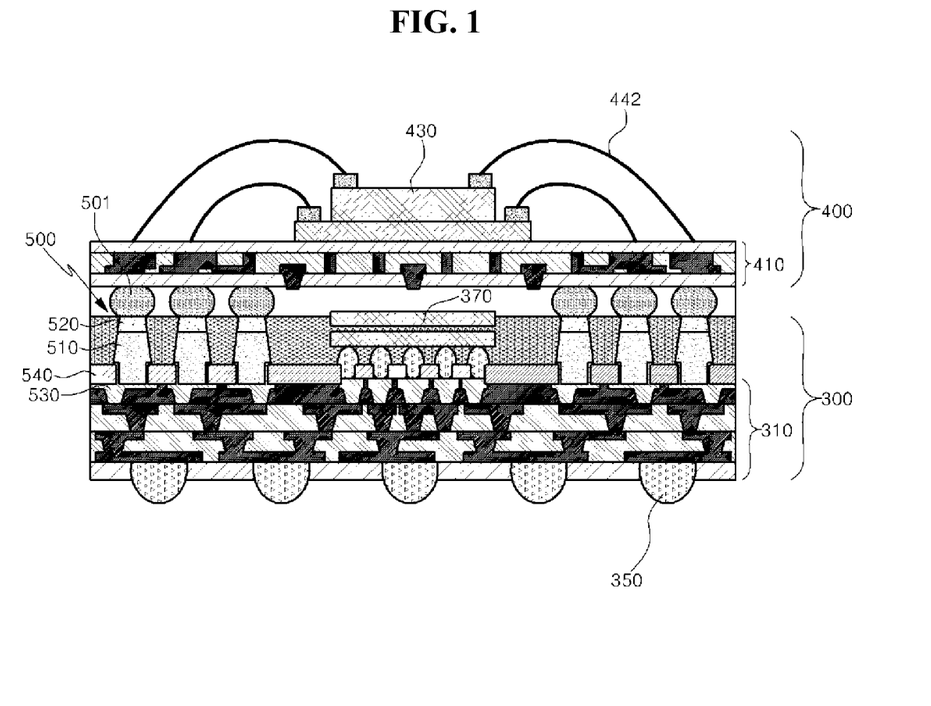
FIG. 1 is a cross-sectional view of a semiconductor package according to an embodiment of the present invention.

FIG. 1 is a cross-sectional view of a semiconductor package according to an embodiment of the present invention.

Referring to FIG. 1, a semiconductor package according to an embodiment of the present invention may be configured in a package in a package on package (POP) type in which an upper package 400 is laminated on a lower package 300 so that the upper and lower packages can be electrically connected to each other.

The semiconductor package includes the lower package 300, the upper package 400 and a metal post 500.

In the lower package 300, at least one lower element 370 is mounted to a lower package substrate 310, and in the upper package 400, at least one upper element 430 is mounted to an upper package substrate 410. Meanwhile, the element 430 may be composed of a semiconductor.

At this time, at least any one of the lower package substrate 310 and the upper package substrate 410 may be composed of a printed circuit board (PCB).

As one example, the lower package 300 may include the lower package substrate 310 and the lower element 370 mounted to the lower package substrate. When the lower element 370 is configured in plural number, the plurality of lower elements 370 may be laminated by interposing an insulating material layer therebetween.

External terminals 350 in a solder ball form, which electrically connect the semiconductor package to an external device, may be provided on a lower surface of the lower package substrate 310.

Similarly, the upper package 400 may include the upper package substrate 410 and the upper element 430 mounted to an upper surface of the upper package substrate 410. When the upper element 430 is configured in plural number, the upper elements 430 may be laminated by interposing an insulating material layer therebetween.

The upper element 430 and the upper package substrate 410 may be electrically connected to each other via a plurality of bonding wires 442.

The metal post 500 is connected to the lower package 300 which is configured as above.

More specifically, a first seed pattern portion 530 may be formed on the substrate of the lower package 300, and the metal post 500 may be formed on the first seed pattern portion 530.

At this time, the metal post 500 may include at least one metal material portion 510, and at this time, the metal post may be composed of a solder portion 510 of a first metal material and a metal material portion of a second metal material or the surface treatment layer 520 and the metal material portion 510.

According to the embodiment of the present invention, the solder portion 510 may be made of an alloy material of Sn and Cu or an alloy material of Sn and Ag so as to be made of a high melting point-solder material having a melting point of 230° C. to 250° C., and the metal material portion 520 may be made of a copper material.

When a general solder material is used, the general solder material has a melting point of 210° C. to 220° C. However, like in the embodiment of the present invention, when the solder portion 510 is made of the high melting point-solder material having a melting point of 230° C. to 250° C., excellent bonding reliability can be obtained, and thus upon laminating the upper package 400, a stable yield rate of the process can be secured.

Also, as illustrated in FIG. 1, the solder portion 510 may be configured such that an upper surface protrudes upwardly higher than a solder resist 540 of the lower package 300.

The metal post 500 which is configured as above may be connected to the upper package 400 via a solder ball 501.

When the metal post 500 including the solder portion 510 of the high melting point-solder material is configured, a stable yield rate of the process upon limiting the upper package 400 can be ensured, and by increasing a distance between the upper package 400 and the lower package 300, high density-based lamination of the semiconductor chips may be performed, and the semiconductor package having improve reliability and stability may be formed.

Meanwhile, when the metal post 500 is composed of the surface treatment layer 520 and the metal material portion 510, the surface treatment layer 520 may be formed as a plated layer using a metal material. More specifically, the surface treatment layer 520 may be made of at least one material of Au and Ni.

As shown in the embodiment of the present invention, when the surface treatment layer 520 is formed on the surface of the metal post 500, bonding reliability with the upper package 400 may be improved and a stable yield rate of the process upon laminating the upper package 400 may be ensured. In addition, since the metal post 500 is prevented from being oxidized, reliability of the semiconductor package can be secured.

Meanwhile, the metal post 500 is configured such that a width of an end of the metal post connected to a side of the lower package 300 is formed larger than that of an end of the metal post connected to a side of the upper package 400.

More specifically, as illustrated in FIG. 1, the metal post 500 may be configured such that a width of one end of the metal post connected to the solder ball 501 is formed smaller than a width of another end opposed to the one end, and at this time, the width of the metal post 500 is configured to reduce gradually from the other end to the one end.

That is, the metal post 500 may be configured such that a width of an upper part reduces gradually from a width of the side connected to the lower package substrate 310.

At this time, when the width of the one end of the metal post 500 is formed in a size of 50% or less of that of the other end of the metal post 500, or the metal post 500 is configured to be inclined at an angle of 45° or less from the surface of the lower package substrate 310, with regard to bonding reliability with the solder ball 501, a problem is generated.

Accordingly, the metal post 500 is configured such that the width of the one end is 50 to 90% of the width of the other end, or a surface in a longitudinal direction is inclined at an angle of 5° to 45° in a vertical direction in a surface of a substrate of the lower package, so that bonding reliability of the metal post 500 and the solder ball 501 can be secured.

At this time, the metal post 500 may be made of Cu.

The metal post 500, which is formed as above, is connected to the upper package 400 via the solder ball 501 in such a manner that at least a part of an upper end of the metal post 500 is inserted into the solder ball 501.

Also, since the metal post 500 is formed on a surface corresponding to the vertical direction in the surface of the lower package substrate 310 so as not to have a stepped cone, it is advantageous in that an electrical property can be uniformly maintained, and bonding strength with the upper package 400 can be improved with only the solder ball 501 which is smaller in the amount.

As such, according to the embodiment of the present invention, as the metal post is configured such that the width (a) of the one end of the metal post is 50% to 90% of the width (b) of the other end, the surface in a longitudinal direction is inclined at an angle of 5° to 45° in the vertical direction in the surface of a substrate of the lower package, an amount of the solder ball 501 formed on the substrate 410 of the upper package 400 can be reduced, and as bonding in a form in which the metal post 500 is surrounded by the solder ball 501 is performed, bonding reliability can be further improved.

Figure 2:
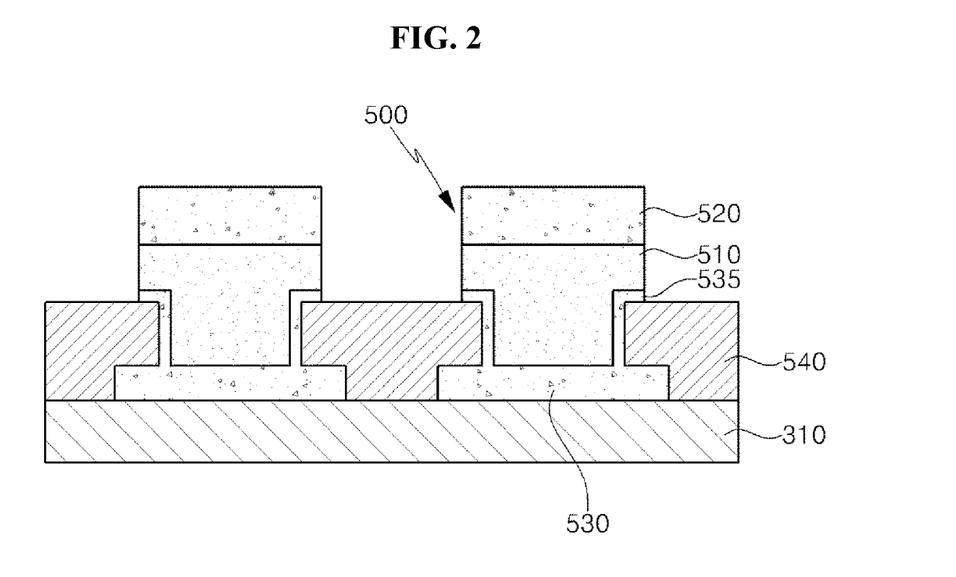
FIG. 2 is a cross-sectional view of a metal post of the semiconductor package according to the embodiment of the present invention.

FIG. 2 is a cross-sectional view of the metal post of the semiconductor package according to the embodiment of the present invention, and the embodiment of FIG. 2 shows a structure in which the solder portion 510 of the metal post 500 protrudes upwardly higher than a solder resist pattern 540.

The configuration of the metal post of the semiconductor package according to the embodiment of the present invention will be described with reference to FIG. 2.

As illustrated in FIG. 2, the first seed pattern portion 530 is formed on the substrate 310, and the solder resist pattern 540 is formed on a peripheral part of the first seed pattern portion 530.

A second seed pattern portion 535 connected to the first seed pattern portion 530 is formed on the solder resist pattern 540.

Meanwhile, the metal post 500 is formed on the second seed pattern portion 535.

At this time, the metal post 500 may include the solder portion 510 and the metal material portion 520 or the surface treatment layer 520 may be formed at the upper end of the metal post 510. The metal post 500 protrudes upwardly higher than the solder resist pattern 540.

Figure 3:
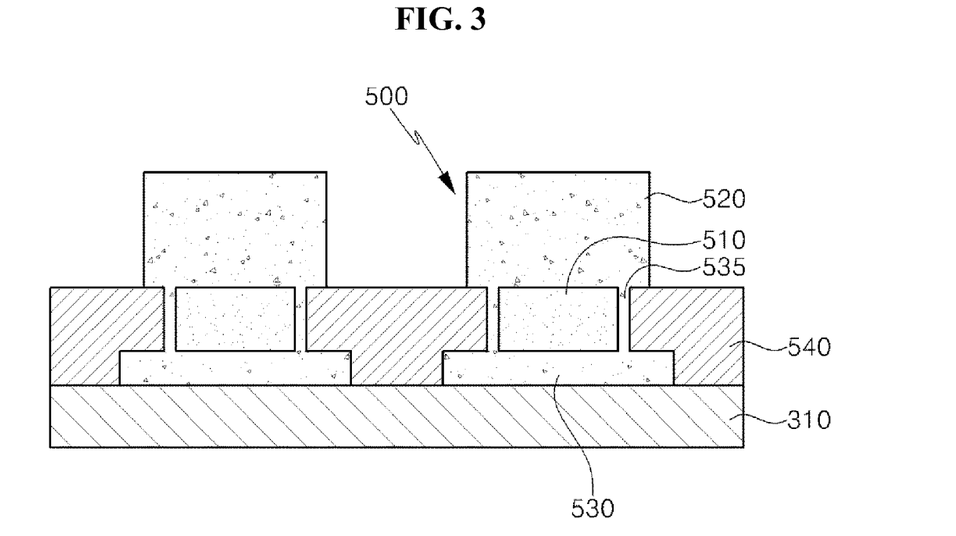
FIG. 3 is a cross-sectional view of a metal post of a semiconductor package according to another embodiment of the present invention.

FIG. 3 is a cross-sectional view of a metal post of a semiconductor package according to another embodiment of the present invention, and the embodiment of FIG. 3 shows a structure in which the solder portion 510 of the metal post is configured in the same plane height as the solder resist pattern 540.

The configuration of the metal post of the semiconductor package according to another embodiment of the present invention will be described with reference to FIG. 3.

As illustrated in FIG. 3, the first seed pattern portion 530 is formed on the substrate 310, and the solder resist pattern 540 is formed at the peripheral part of the first seed pattern portion 530.

The second seed pattern portion 535 connected to the first seed pattern portion 530 is formed on the solder resist pattern 540, and at this time, the second seed pattern portion 535 is formed at a side except for an upper surface of the solder resist pattern 540.

The metal post 500 is formed on the second seed pattern portion 535, and at this time, the metal post 500 includes the solder portion 510 and the metal material portion, and the solder portion 510 is configured in the same plane height as the solder resist pattern 540.

The solder portion 510 may be made of a high welting point solder material having a melting point of 230° C. to 250° C., such as an alloy material of Sn and Cu or an alloy material of Sn and Ag, and the metal material portion 520 may be made of a copper material.

FIGS. 4 to 12 are views for explaining a method of manufacturing the metal post of the semiconductor package according to the embodiment of the present invention, namely, views for explaining the method of manufacturing the metal post of the semiconductor package according to the embodiment of FIG. 2.

Figure 4:
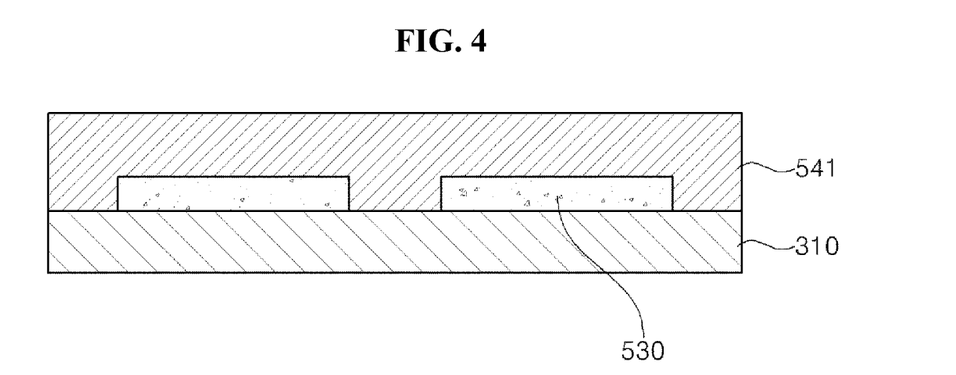
FIGS. 4 to 12 are views for explaining a method of manufacturing the metal post of the semiconductor package according to the embodiment of the present invention.

As illustrated in FIG. 4, the first seed pattern portion 530 is formed on the substrate 310, and the solder resist layer 541 is formed on the first seed pattern portion 530 which is formed as above.

Figure 5:
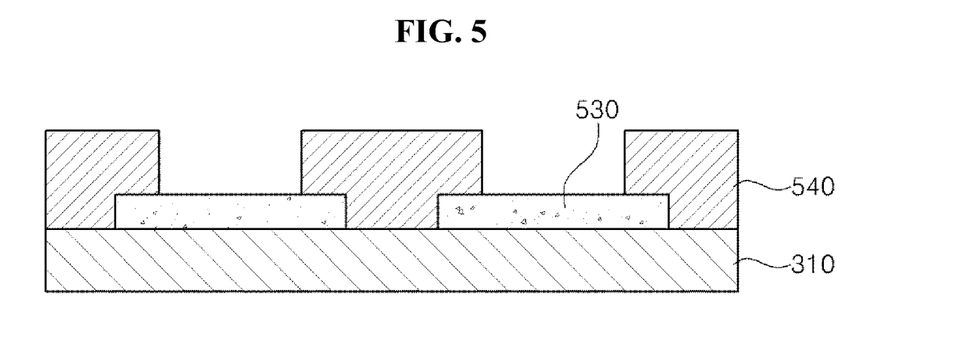

After this, as illustrated in FIG. 5, the solder resist pattern 540 is formed by patterning the solder resist layer formed on the first seed pattern portion 530.

Figure 6:
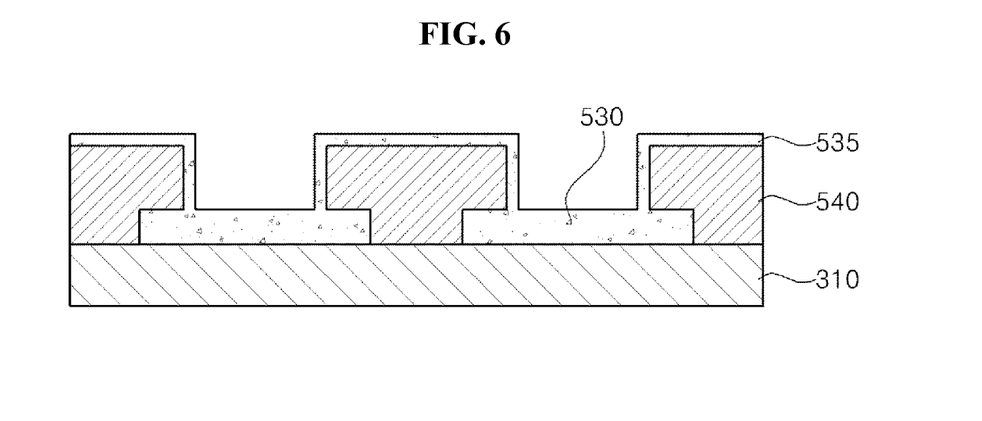

As illustrated in FIG. 6, the second seed pattern portion 535 is formed on the solder resist pattern 540 which is formed as above.

Figure 7:
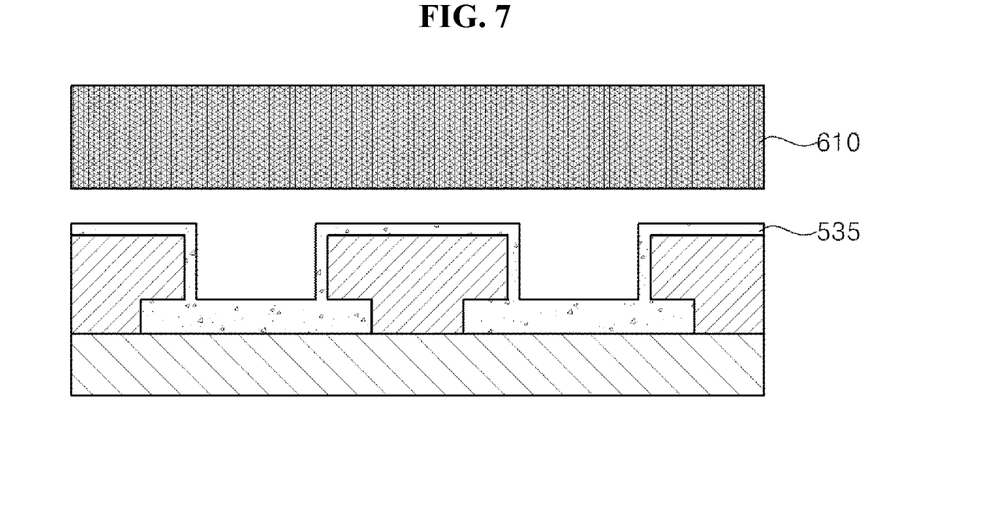
Figure 8:
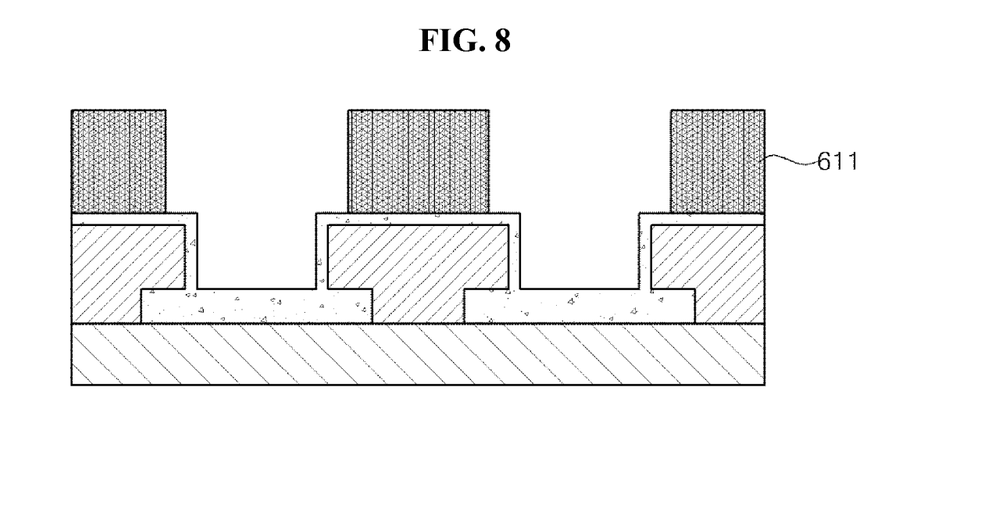

After this, as illustrated in FIG. 7, a photo resist layer 610 is formed on the second seed pattern portion 535, and as illustrated in FIG. 8, a photo resist pattern 611 is formed by laminating, exposing and developing the photo resist layer 610.

Meanwhile, the photo resist layer 610 and the photo resist patterns 611 may be made of a dry film photo resist (DFR).

Figure 9:
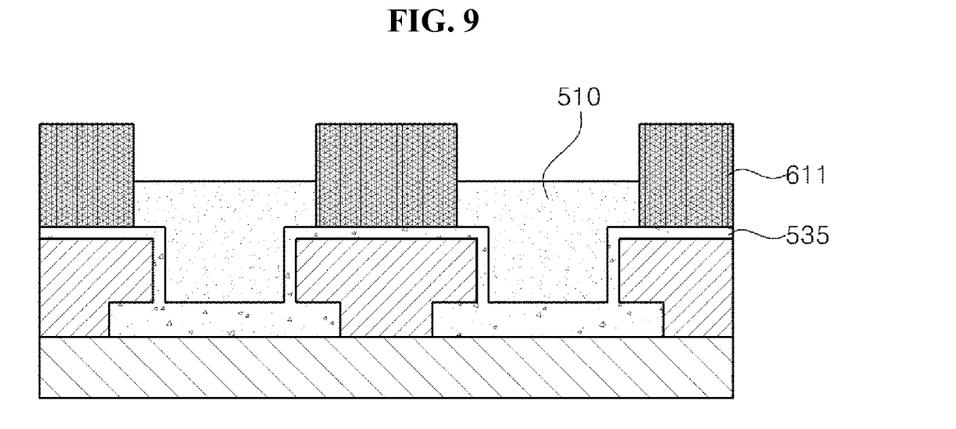

After this, as illustrated in FIG. 9, the solder portion 510 may be formed on the second seed pattern portion 535 between the photo resist pattern 611 and the adjacent photo resist pattern using a high melting point-solder material or the metal material portion 510 may be formed.

At this time, according to the embodiment of the present invention, the solder portion 510 may be made of a high melting point-solder material having a melting point of 230° C. to 250° C., such as an alloy material of Sn and Cu or an alloy material of Sn and Ag.

Figure 10:
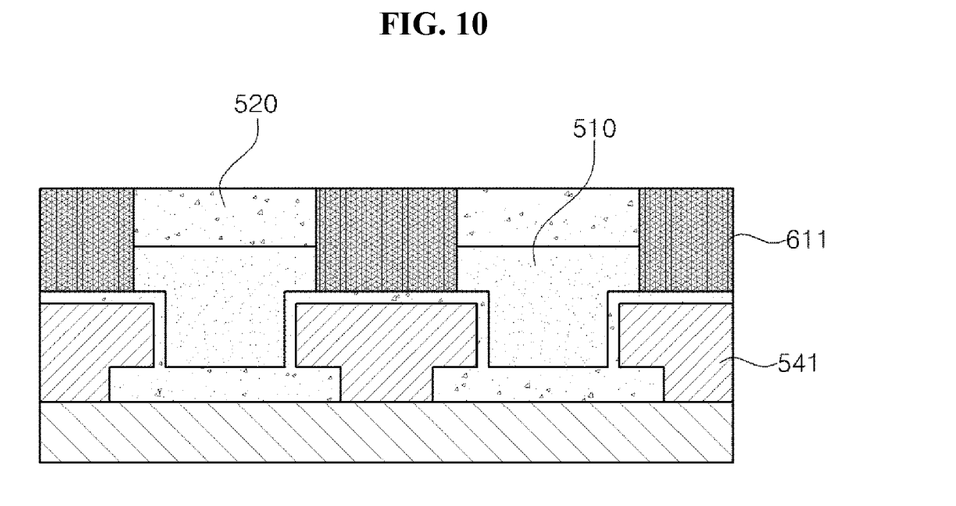

After this, as illustrated in FIG. 10, the metal material portion 520 is formed by performing plating on the solder portion 510 using a metal material. At this time, the metal material portion 520 may be made of a copper material.

Figure 11:
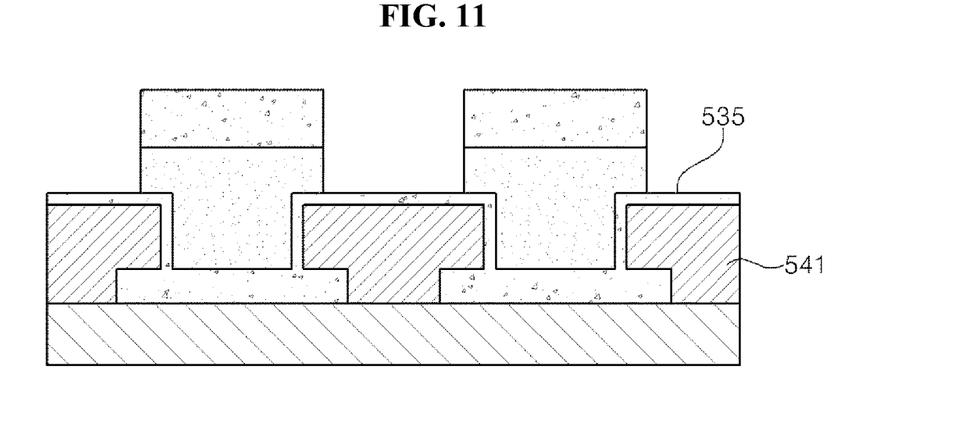
Figure 12:
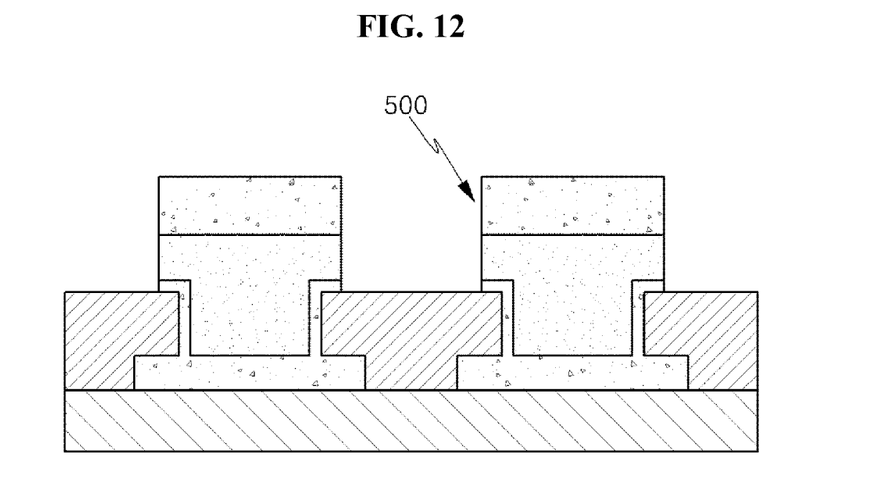

After this, by removing the photo resist pattern 611, as illustrated in FIG. 11, the second pattern portion 535 is exposed to the solder resist layer 541, and by removing the exposed second seed pattern portion 535, as illustrated in FIG. 12, the metal post 500 is completed.

According to the embodiment of the present invention, a distance between the upper package and the lower package is increased by the metal post which is configured as above so that high density-based lamination of the semiconductor chips can be performed and the semiconductor package having improved reliability and stability can be provided.

FIGS. 13 to 21 are views for explaining a method of manufacturing the metal post of the semiconductor package according to another embodiment of the present invention, namely, views for explaining the metal post of the semiconductor package according to the embodiment of FIG. 3.

Figure 13:
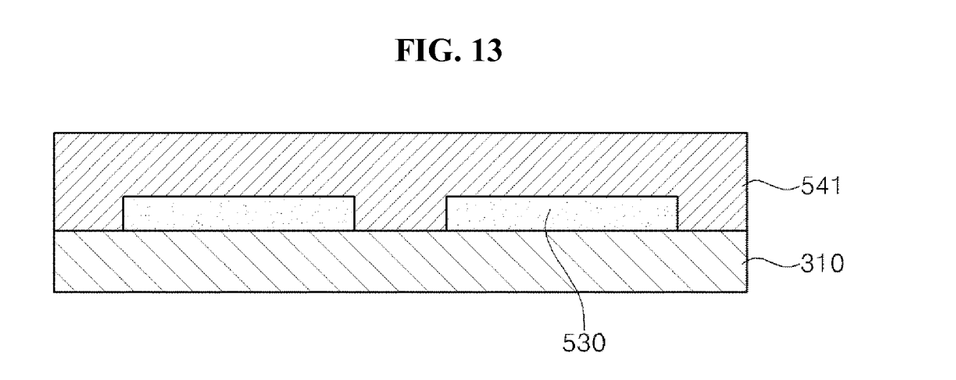
FIGS. 13 to 21 are views for explaining a method of manufacturing the metal post of the semiconductor package according to the other embodiment of the present invention.
Figure 14:
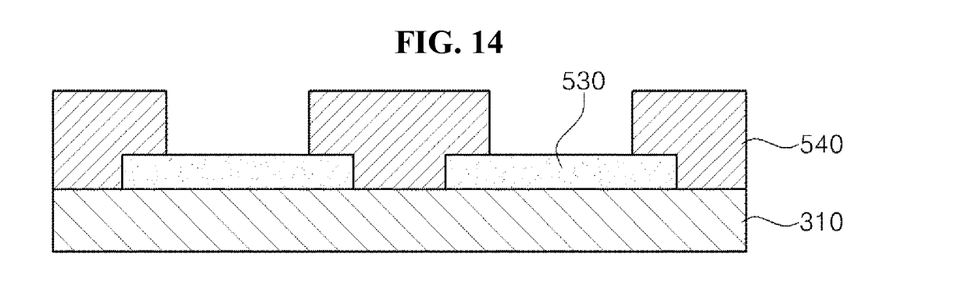

As illustrated in FIG. 13, the first seed pattern portion 530 is formed on the substrate 310, the solder resist layer 541 is formed on the first seed pattern portion 530, and as illustrated in FIG. 14, the solder resist pattern 540 is formed by patterning the solder resist layer 541 formed on the first seed pattern portion 530.

Figure 15:
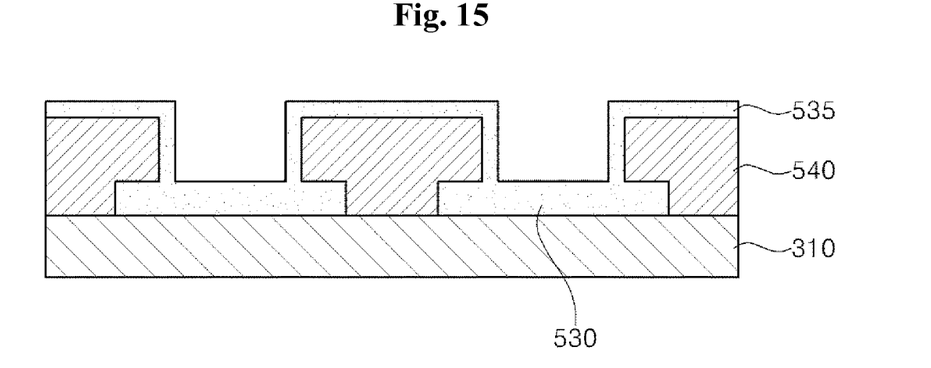
Figure 16:
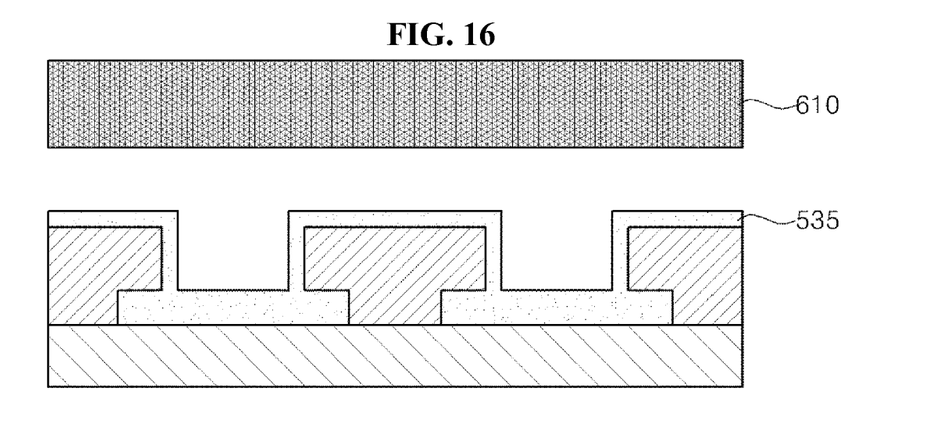
Figure 17:
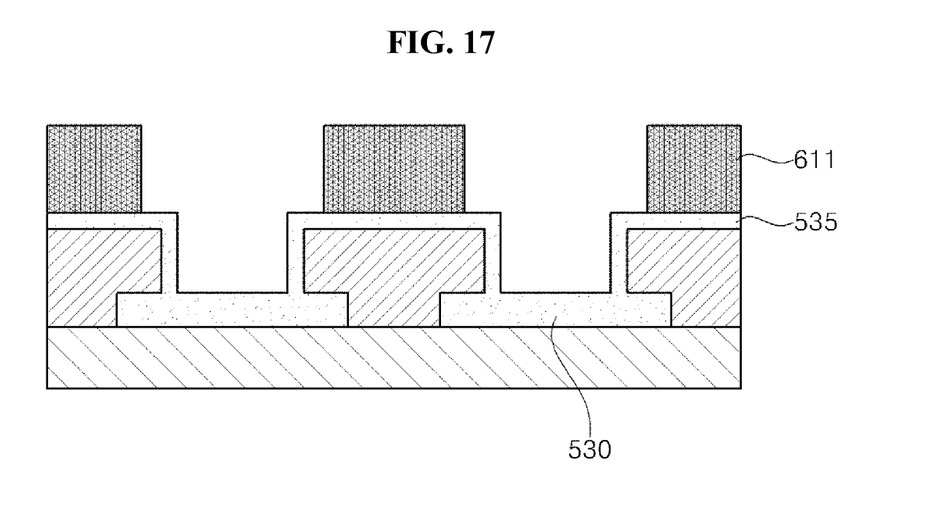

As illustrated in FIG. 15, the second seed pattern portion 535 is formed on the solder resist pattern 540 which is formed as above, and as illustrated in FIG. 16, the photo resist layer 610 is formed on the second seed pattern portion 535, and as illustrated in FIG. 17, the photo resist patterns 611 are formed by laminating, exposing and developing the photo resist layer 610.

At this time, the photo resist layer 610 and the photo resist pattern 611 may be formed of DFR (Dry Film PhotoResist).

Figure 18:
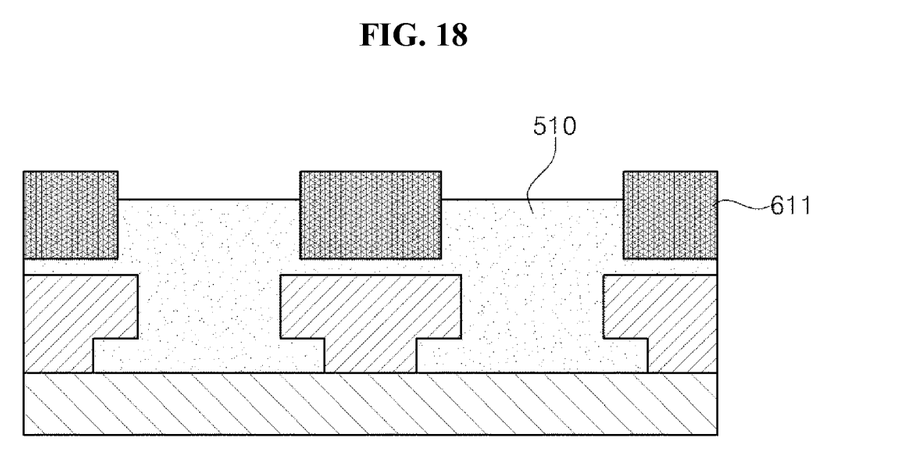

After this, as illustrated in FIG. 18, the metal post 510 is formed by filling the first pattern portion 530 and the second seed pattern portion 535 between the photo resist pattern 611 and the adjacent resist pattern with a metal material, and Cu may be used as a metal material for forming the metal post 510.

Figure 19:
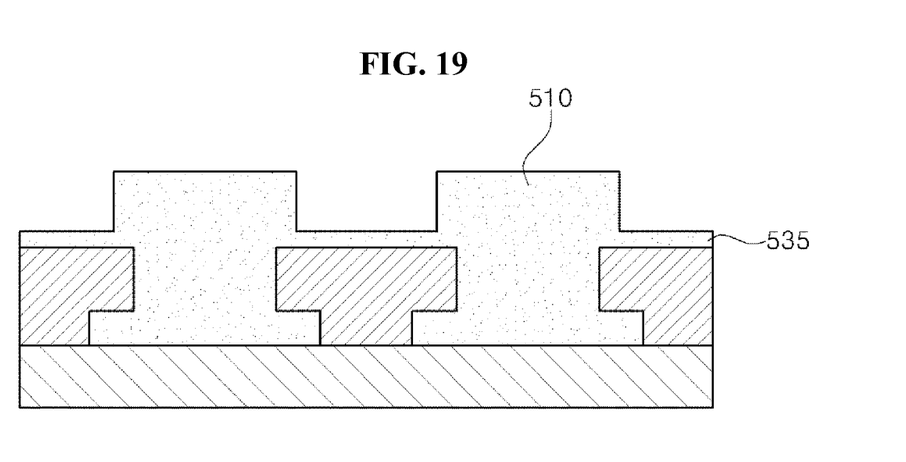
Figure 20:
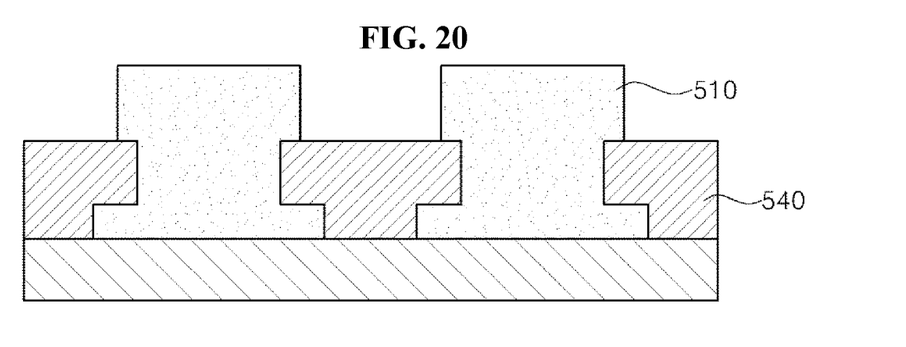

After this, as illustrated in FIG. 19, the second seed pattern portion 535 is exposed by removing the photo resist patterns 611, and as illustrated in FIG. 20, the metal post is formed by removing the exposed second seed pattern portion 535.

Figure 21:
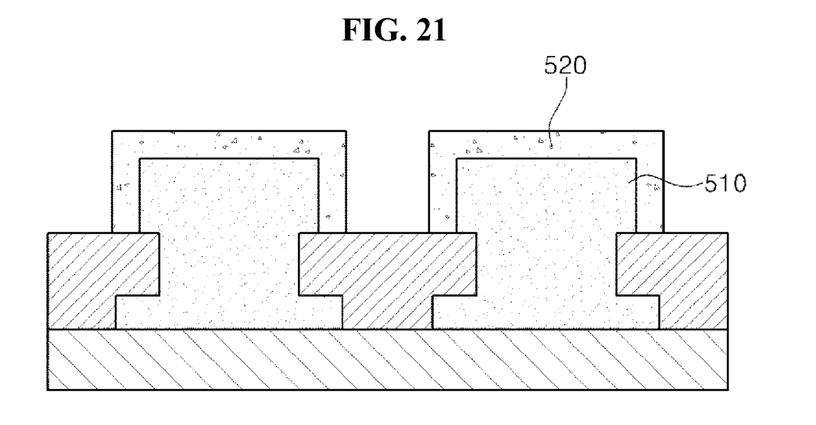

After this, as shown in FIG. 21, the surface treatment layer 520 may be formed on the upper surface and the side of the metal post 510.

Meanwhile, at least one material of Au and Ni may be used as the metal material for forming the surface treatment layer 520.

Figure 22:
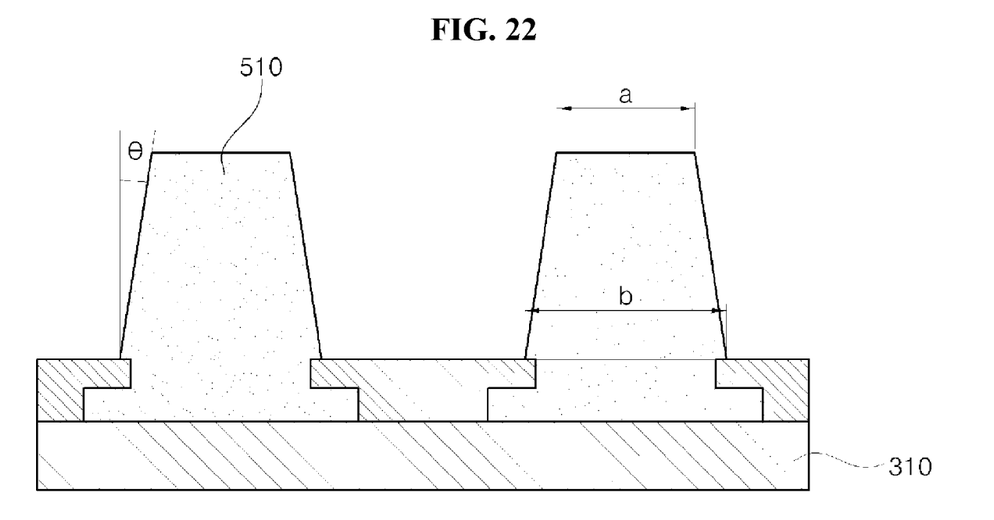
FIG. 22 is a cross-sectional view of a metal post of a semiconductor package according to still another embodiment.

FIG. 22 is a cross-sectional view of a metal post of a semiconductor package according to still another embodiment of the present invention.

As illustrated in FIG. 22, the metal post 510 may be configured such that a width (a) of one end connected to the solder ball 520 is formed smaller than a width (b) of another end opposed to the one end, and at this time, the metal post 510 may be also configured to gradually reduce in a width from the other end to the one end.

That is, the metal post 500 may be configured such that a width (a) of an upper part reduces gradually from a width (b) of the side connected to the lower package substrate 310.

At this time, when the width (a) of the one end of the metal post 500 is formed in a size of 50% or less of the width (b) of the other end of the metal post 500, or the metal post 500 is configured to be inclined at an angle of 45° or less from the surface of the lower package substrate 310, with regard to bonding reliability with the solder ball 501, a problem is generated.

Accordingly, the metal post 500 is configured such that the width (a) of the one end is 50 to 90% of the width (b) of the other end, or a surface in a longitudinal direction is inclined at an angle of 5° to 45° in a vertical direction in a surface of a substrate of the lower package, so that bonding reliability of the metal post 500 and the solder ball 50 can be secured.

At this time, the metal post 510 is formed of Cu, and the metal post 511 is configured to contain at least one of Cu, Sn, Pb and Ag.

The metal post 510, which is formed as above, is connected to the upper package 400 via the solder ball 520 such that at least a part of the upper end of the metal post 510 is inserted into the solder ball 520.

Also, since the metal post 510 is formed on surface corresponding to a vertical direction from the substrate of the lower package 310 so as not to have a stepped cone, it is advantageous in that an electrical property can be uniformly maintained, and bonding strength with the upper package 400 can be improved with only the solder ball 501 which is smaller in the amount.

As such, according to the embodiment of the present invention, as the metal post is configured such that the width (a) of the one end of the metal post is 50% to 90% of the width (b) of the other end, the surface in a longitudinal direction is inclined at an angle of 5° to 45° in the vertical direction in the surface of a substrate of the lower package, an amount of the solder ball 501 formed on the substrate 410 of the upper package 400 can be reduced, and as bonding in a form in which the metal post 500 is surrounded by the solder ball 501 is performed, bonding reliability can be further improved.

Meanwhile, a height of the metal post 510 is formed higher than that of the semiconductor chip 370 mounted to the lower package 300, and at this time, in consideration of a size of the semiconductor chip 370, a height of the metal post is formed to range from 50 to 400 μm so that the semiconductor chip 370 can be disposed in a spaced space generated between the upper package 400 and the lower package 300 due to the metal post 510, thereby enabling the semiconductor chip not to be in contact with the upper package 400.

As set forth above, according to some embodiments of the present invention, as a distance between the upper package and the lower package is increased, the number of mounted chips is increased so that high density can be realized, and the semiconductor package having bonding reliability between the upper package and the lower package can be provided.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A semiconductor package, comprising:
   a lower package to which a lower element is mounted and including a first seed pattern portion;
   a second seed pattern portion formed on the first seed pattern portion;
   a metal post connected to the lower package through the second seed pattern portion and including at least one metal material portion; and
   an upper package to which an upper element is mounted, and which is connected to the metal post via a solder ball;
   wherein the second seed pattern portion is in direct physical contact with a side surface of the metal post.

2. The semiconductor package of claim 1, wherein the metal material portion has a surface treatment layer formed on a surface thereof.

3. The semiconductor package of claim 2, wherein the surface treatment layer is formed on an upper surface and a side of the metal post.

4. The semiconductor package of claim 2, wherein the surface treatment layer is made of at least one metal material of Au and Ni.

5. The semiconductor package of claim 4, further comprising a solder resist pattern formed on the first seed pattern portion so that a part of an upper surface of the first seed pattern portion can be exposed.

6. The semiconductor package of claim 1, wherein the metal post is configured such that a width of one end of the metal post connected to the solder ball is smaller than that of another end.

7. The semiconductor package of claim 1, wherein a width of the metal post increases gradually from the one end connected to the solder ball to the other end.

8. The semiconductor package of claim 1, wherein the metal post includes a solder portion of a first metal material and a metal material portion of a second metal material.

9. The semiconductor package of claim 8, wherein the solder portion is made of an alloy material of Sn and Cu or an alloy material of Sn and Ag.

10. The semiconductor package of claim 8, wherein the solder portion has a melting point of 230° C. to 250° C.

11. The semiconductor package of claim 8, wherein the second metal material comprises copper.

12. The semiconductor package of claim 1, wherein the lower package includes: a substrate, wherein the first seed pattern portion is formed on the substrate, and wherein the metal post is formed on the first seed pattern portion.

13. A semiconductor package, comprising:
a lower package to which a lower element is mounted;
a metal post connected to the lower package and including at least one metal material portion; and
an upper package to which an upper element is mounted, and which is connected to the metal post via a solder ball;
wherein the metal post is configured such that a width of one end is formed in 50% to 90% of a width of another end.

14. The semiconductor package of claim 13, wherein the one end of the metal post connected to the solder ball is entered into the solder ball.

15. The semiconductor package of claim 13, wherein the metal post is made of at least one material of Cu, Sn, Pb, and Ag.

16. A semiconductor package, comprising:
a lower package to which a lower element is mounted;
a metal post connected to the lower package and including at least one metal material portion; and
an upper package to which an upper element is mounted, and which is connected to the metal post via a solder ball;
wherein the metal post is configured such that a surface in a longitudinal direction is inclined at an angle of 5° to 45° with respect to a surface of a substrate of the lower package.

* * * * *